US012805399B2

(12) United States Patent
Hsu et al.

(10) Patent No.: US 12,805,399 B2
(45) Date of Patent: Nov. 17, 2026

(54) PACKAGE STRUCTURE AND MANUFACTURING METHOD THEREOF

(71) Applicant: INDUSTRIAL TECHNOLOGY RESEARCH INSTITUTE, Hsinchu (TW)

(72) Inventors: Chao-Kai Hsu, Zhubei CIty (TW); Chih-Cheng Hsiao, Hsinchu County (TW); Ching-Feng Yu, Miaoli County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 366 days.

(21) Appl. No.: 18/430,505

(22) Filed: Feb. 1, 2024

(65) Prior Publication Data

US 2025/0174609 A1 May 29, 2025

(30) Foreign Application Priority Data

Nov. 28, 2023 (TW) ................................ 112145984

(51) Int. Cl.
*H10W 90/00* (2026.01)
*H10D 1/68* (2025.01)
(Continued)

(52) U.S. Cl.
CPC .............. *H10W 90/00* (2026.01); *H10D 1/68* (2025.01); *H10W 70/611* (2026.01);
(Continued)

(58) Field of Classification Search
CPC ............. H10W 80/312; H10W 80/314; H10W 90/271; H10W 90/401; H10W 90/794; H10W 70/611
See application file for complete search history.

(56) References Cited

U.S. PATENT DOCUMENTS

| | | | |
|---|---|---|---|
| 6,887,769 | B2 | 5/2005 | Kellar et al. |
| 7,041,178 | B2 | 5/2006 | Tong et al. |

(Continued)

FOREIGN PATENT DOCUMENTS

| | | | |
|---|---|---|---|
| CN | 104051288 | A | 9/2014 |
| CN | 112530912 | A | 3/2021 |

(Continued)

OTHER PUBLICATIONS

TW Office Action dated Oct. 22, 2024 in application 112145984.

*Primary Examiner* — David A Zarneke
(74) *Attorney, Agent, or Firm* — Maschoff Brennan

(57) ABSTRACT

A package structure and manufacturing method thereof. The package structure includes first package assembly and a second package assembly. The first package assembly includes a first dielectric layer, a first chip and a first conductive structure. The first chip is disposed in the first dielectric layer, and a first electrical connection surface of the first conductive structure is exposed on a first bonding surface of the first dielectric layer. The second package assembly includes a second dielectric layer, a second chip and a second conductive structure. The second chip is disposed in the second dielectric layer, and a second electrical connection surface of the second conductive structure is exposed on a second bonding surface of the second dielectric layer. The first bonding surface is directly bonded to the second bonding surface, and the first electrical connection surface is directly bonded to the second electrical connection surface.

15 Claims, 19 Drawing Sheets

(51) Int. Cl.

| | |
|---|---|
| ***H10W 70/60*** | (2026.01) |
| ***H10W 70/63*** | (2026.01) |
| ***H10W 80/00*** | (2026.01) |
| ***H10W 90/20*** | (2026.01) |

(52) U.S. Cl.

CPC ....... *H10W 70/635* (2026.01); *H10W 80/314* (2026.01); *H10W 90/271* (2026.01); *H10W 90/401* (2026.01); *H10W 80/312* (2026.01); *H10W 80/327* (2026.01); *H10W 90/794* (2026.01)

(56) References Cited

U.S. PATENT DOCUMENTS

| | | | | |
|---|---|---|---|---|
| 7,332,410 | B2 | 2/2008 | Tong | |
| 8,289,725 | B2 | 10/2012 | Fan | |
| 8,735,219 | B2 | 5/2014 | Enquist et al. | |
| 8,802,538 | B1 | 8/2014 | Liu et al. | |
| 9,331,032 | B2 | 5/2016 | Liu et al. | |
| 9,666,566 | B1 | 5/2017 | Chen et al. | |
| 9,917,073 | B2 | 3/2018 | Mohammed | |
| 10,340,247 | B2 | 7/2019 | Lin | |
| 10,515,848 | B1 | 12/2019 | Kuo et al. | |
| 11,063,022 | B2 | 7/2021 | Chen et al. | |
| 11,088,100 | B2 | 8/2021 | Hsu et al. | |
| 11,114,433 | B2 | 9/2021 | Chen et al. | |
| 11,195,817 | B2 | 12/2021 | Huang et al. | |
| 11,769,731 | B2 | 9/2023 | Yu et al. | |
| 2017/0186730 | A1 | 6/2017 | Shen et al. | |
| 2019/0139921 | A1 | 5/2019 | Baek et al. | |
| 2021/0265331 | A1 | 8/2021 | Wang et al. | |
| 2021/0366970 | A1 | 11/2021 | Katkar | |
| 2022/0068861 | A1 | 3/2022 | Malatkar et al. | |
| 2022/0262751 | A1* | 8/2022 | Zhang .................. | H10W 70/09 |
| 2022/0328467 | A1 | 10/2022 | Chen et al. | |

FOREIGN PATENT DOCUMENTS

| | | | |
|---|---|---|---|
| CN | 110797270 | B | 7/2021 |
| KR | 10-2022-0140411 | A | 10/2022 |
| TW | 200822302 | A | 5/2008 |
| TW | 1705544 | B | 9/2020 |
| TW | 202032730 | A | 9/2020 |
| TW | 202220133 | A | 5/2022 |
| TW | 202243035 | A | 11/2022 |
| TW | 202345381 | A | 11/2023 |

* cited by examiner

PACKAGE STRUCTURE AND MANUFACTURING METHOD THEREOF

CROSS-REFERENCE TO RELATED APPLICATIONS

All related applications are incorporated by reference. The present application is based on, and claims priority from, Taiwan (International) application No. 112145984 filed on Nov. 28, 2023, the disclosure of which is hereby incorporated by reference herein in its entirety.

TECHNICAL FIELD

The disclosure relates to a package structure and a manufacturing method thereof.

BACKGROUND

In order to realize the signal transfer between two package assemblies, when the two package assemblies are bonded into a package structure, one or more bumps are usually used to electrically connect the contacts of the two package assemblies.

However, such electrical connection between contacts created by the bumps not only reduces the reliability of the package structure by causing warpage thereon, but also limits the density and performance of the package structure by enlarging the volume thereof. In addition, since there is a gap between the two package assemblies that are electrically connected via bumps, it is required to complete the bonding of the two package assemblies via a packaging process performed by filling additional molding compound in the gap between the two package assemblies.

SUMMARY

One embodiment of this disclosure provides a package structure including a first package assembly and a second package assembly. The first package assembly includes a first dielectric layer, a first chip and a first conductive structure. The first chip is disposed in the first dielectric layer, and a first electrical connection surface of the first conductive structure is exposed on a first bonding surface of the first dielectric layer. The second package assembly includes a second dielectric layer, a second chip and a second conductive structure. The second chip is disposed in the second dielectric layer, and a second electrical connection surface of the second conductive structure is exposed on a second bonding surface of the second dielectric layer. The first bonding surface of the first dielectric layer is directly bonded to the second bonding surface of the second dielectric layer, and the first electrical connection surface is directly bonded to the second electrical connection surface.

Another embodiment of this disclosure provides a manufacturing method of a package structure including providing a first package assembly and a second package assembly, wherein the first package assembly comprises a first dielectric layer, a first chip and a first conductive structure, the first chip is disposed in the first dielectric layer, a first electrical connection surface of the first conductive structure is exposed on a first bonding surface of the first dielectric layer, the second package assembly comprises a second dielectric layer, a second chip and a second conductive structure, the second chip is disposed in the second dielectric layer, and a second electrical connection surface of the second conductive structure is exposed on a second bonding surface of the second dielectric layer; and directly bonding the first bonding surface of the first dielectric layer to the second bonding surface of the second dielectric layer, and directly bonding the first electrical connection surface of the first conductive structure to the second electrical connection surface of the second conductive structure to form a package structure.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
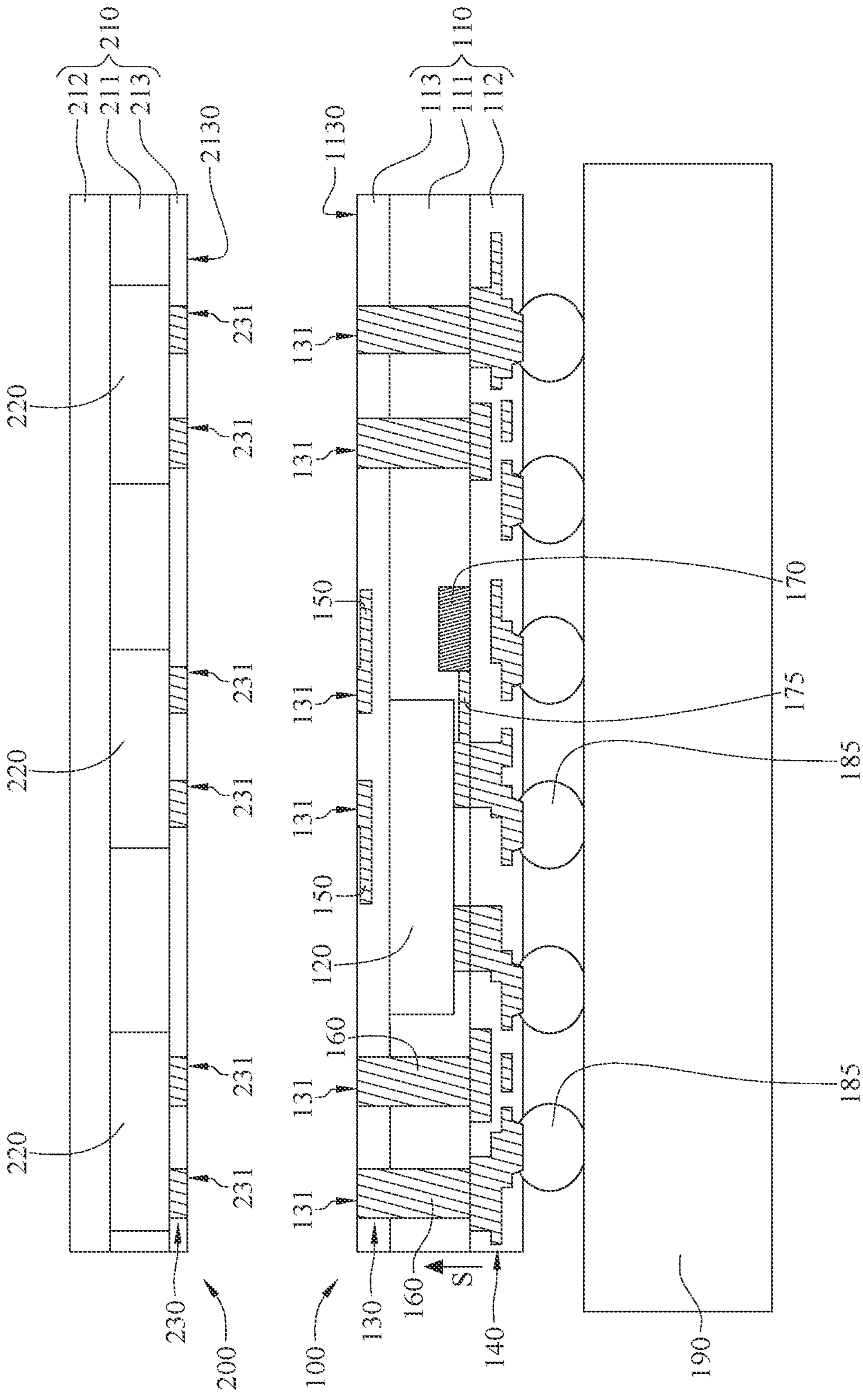
FIGS. 1 to 14 show a manufacturing method of a package structure according to a first embodiment of the disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIGS. 1 to 14. FIGS. 1 to 14 show a manufacturing method of a package structure 10 according to a first embodiment of the disclosure.

As shown in FIG. 1, a first package assembly 100 and a second package assembly 200 are provided.

The first package assembly 100 includes a first dielectric layer 110, a first chip 120, a plurality of first conductive structures 130 and a capacitive structure 170. In this embodiment, the first dielectric layer 110 may include a molding compound 111, a first polymer layer 112 and a second polymer layer 113. The first polymer layer 112 and the second polymer layer 113 are disposed on two opposite sides of the molding compound 111, respectively. The first chip 120 is disposed in the molding compound 111, and is in, for example, a face-down form. The second polymer layer 113 has a first bonding surface 1130 facing away from the molding compound 111.

A plurality of first electrical connection surfaces 131 of the first conductive structure 130 are exposed on the first bonding surface 1130. That is, the first electrical connection surfaces 131 provide a plurality of contacts, respectively. In this embodiment, the first electrical connection surface 131 is flushed with the first bonding surface 1130. In other embodiments, the first conductive structure may have one first electrical connection surface.

In this embodiment, the first conductive structure 130 may include a first circuit layer 140, a second circuit layer 150 and a plurality of first conductive vias 160. The first circuit layer 140 is disposed in the first polymer layer 112. The first circuit layer 140 and the first polymer layer 112 may together be referred as a redistribution layer (RDL). The second circuit layer 150 is disposed in the second polymer layer 113. The second circuit layer 150 and the second polymer layer 113 may together be referred as a RDL. The first conductive vias 160 penetrate through the molding compound 111 and the second polymer layer 113, and electrically connect the first circuit layer 140 and the second circuit layer 150. The first electrical connection surfaces 131 are located on the second circuit layer 150 and the first conductive vias 160.

The capacitive structure 170 is disposed on the first polymer layer 112. The capacitive structure 170 is electrically connected to the first chip 120 via an electrical connection structure 175 disposed on the first polymer layer 112. In this embodiment, the capacitive structure 170 is entirely not overlapped with the first chip 120 along a stacking direction S of the molding compound 111, the first polymer layer 112 and the second polymer layer 113. Accordingly, the overall thickness (i.e., the thickness of the first package assembly 100 along the stacking direction S) of the first package assembly 100 is reduced.

In this embodiment, there may be solder balls 185 and a substrate 190 disposed on a side of the first package assembly 100. The solder balls 185 are electrically connected to the first circuit layer 140, so as to electrically connect the substrate 190 to the first circuit layer 140. In other embodiments, the solder balls 185 and the substrate 190 disposed on a side of the first package assembly may be omitted.

The second package assembly 200 includes a second dielectric layer 210, a plurality of second chips 220 and a second conductive structure 230. In this embodiment, the second dielectric layer 210 may include a molding compound 211, a third polymer layer 212 and a fourth polymer layer 213. The second chips 220 are disposed in the molding compound 211. The third polymer layer 212 and the fourth polymer layer 213 are disposed on two opposite sides of the molding compound 211, respectively. The second conductive structure 230 is, for example, a circuit layer. The second conductive structure 230 is disposed in the fourth polymer layer 213, and is disposed on the second chip 220. The fourth polymer layer 213 has a second bonding surface 2130 facing away from the molding compound 211. A plurality of second electrical connection surfaces 231 of the second conductive structure 230 are exposed on the second bonding surface 2130. That is, the second electrical connection surfaces 231 provide a plurality of contacts, respectively. In addition, in this embodiment, the second electrical connection surface 231 is flushed with the second bonding surface 2130. In other embodiments, the second package assembly may include one second chip. In other embodiments, the second conductive structure 230 may have one second electrical connection surface 231.

Figure 2:
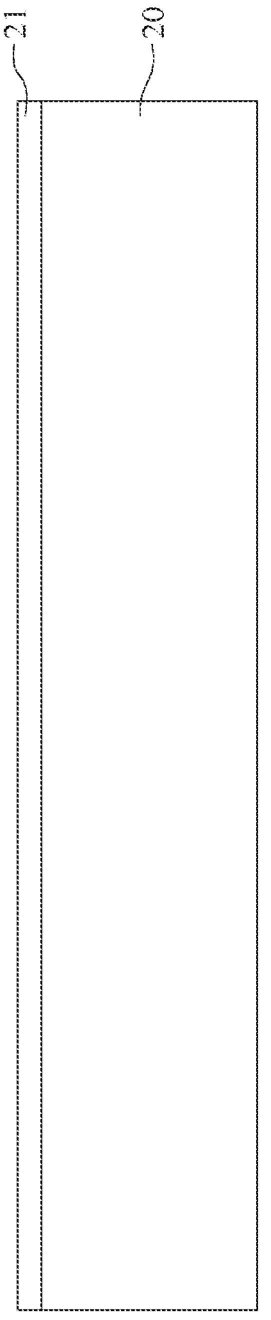
Figure 3:
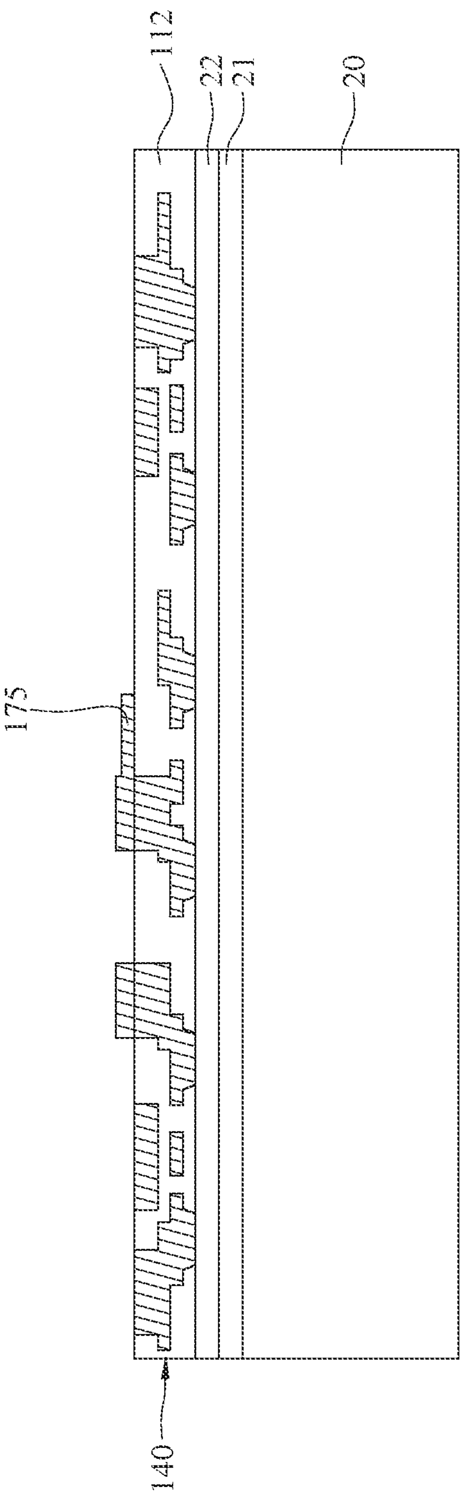
Figure 4:
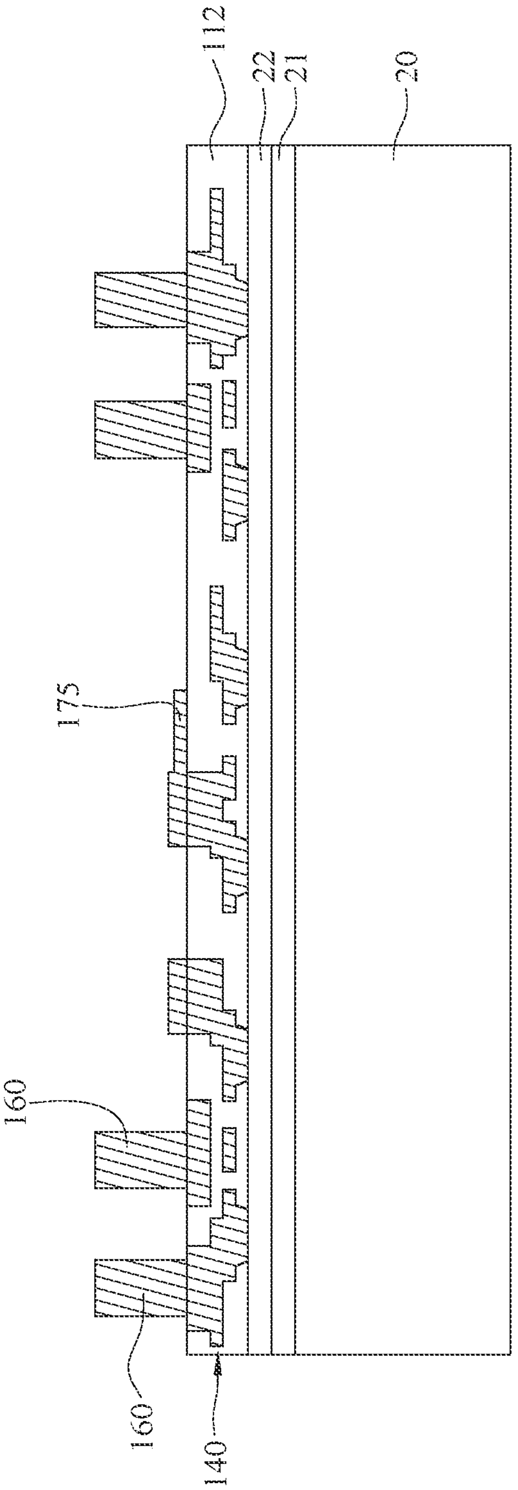
Figure 5:
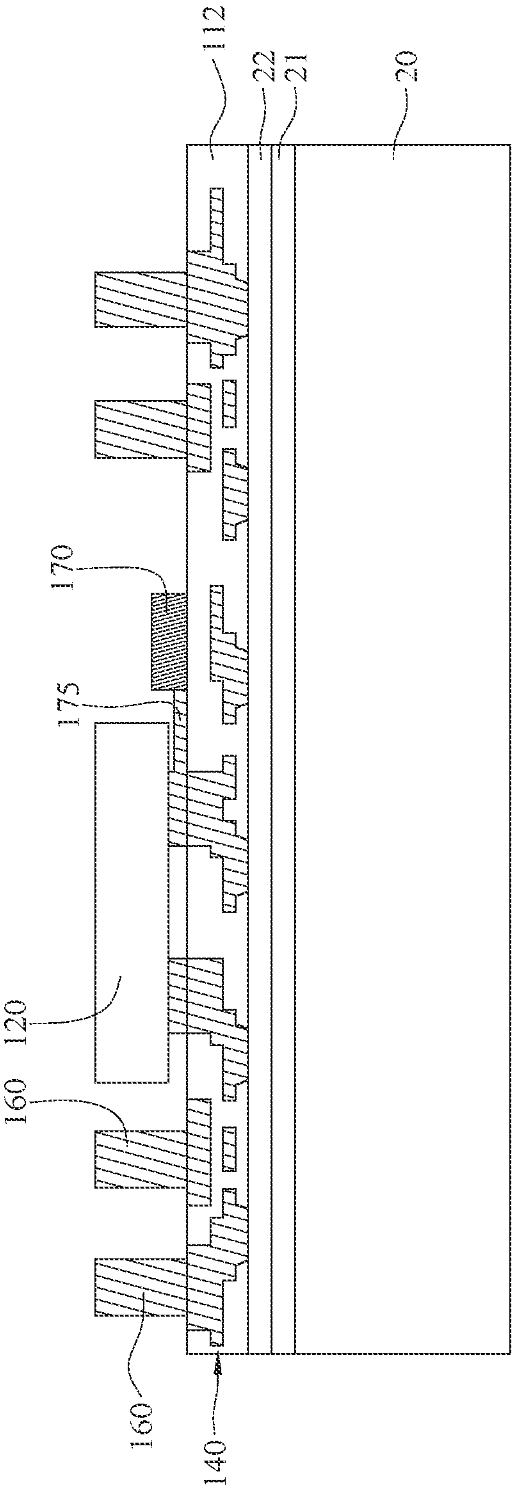
Figure 6:
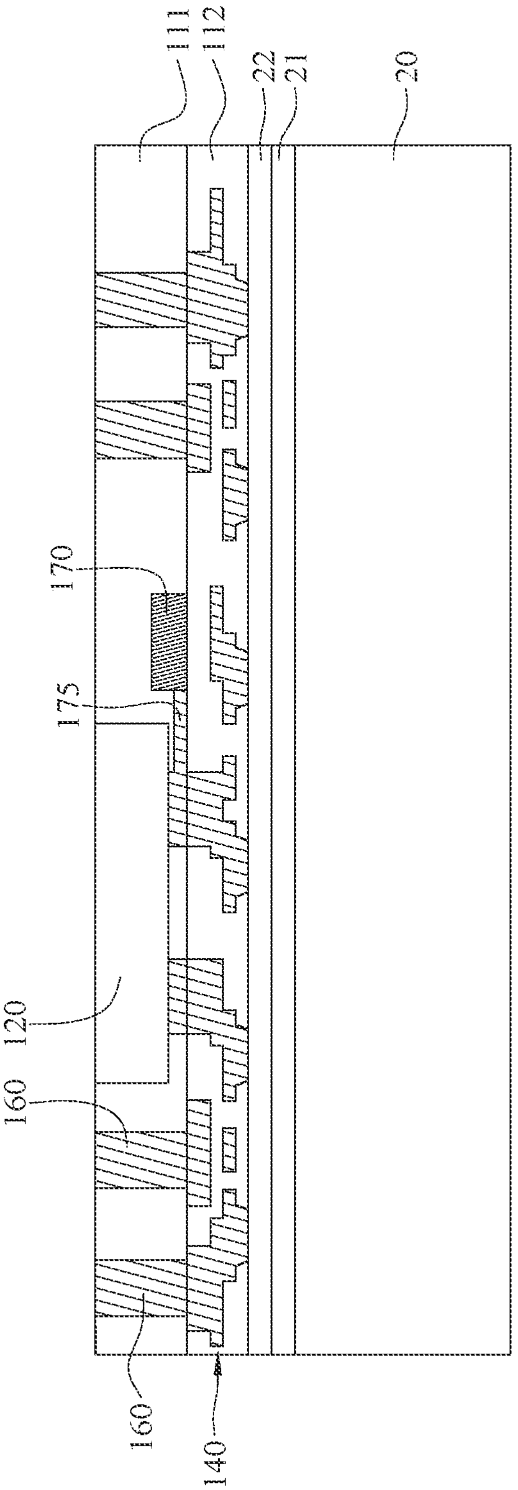
Figure 7:
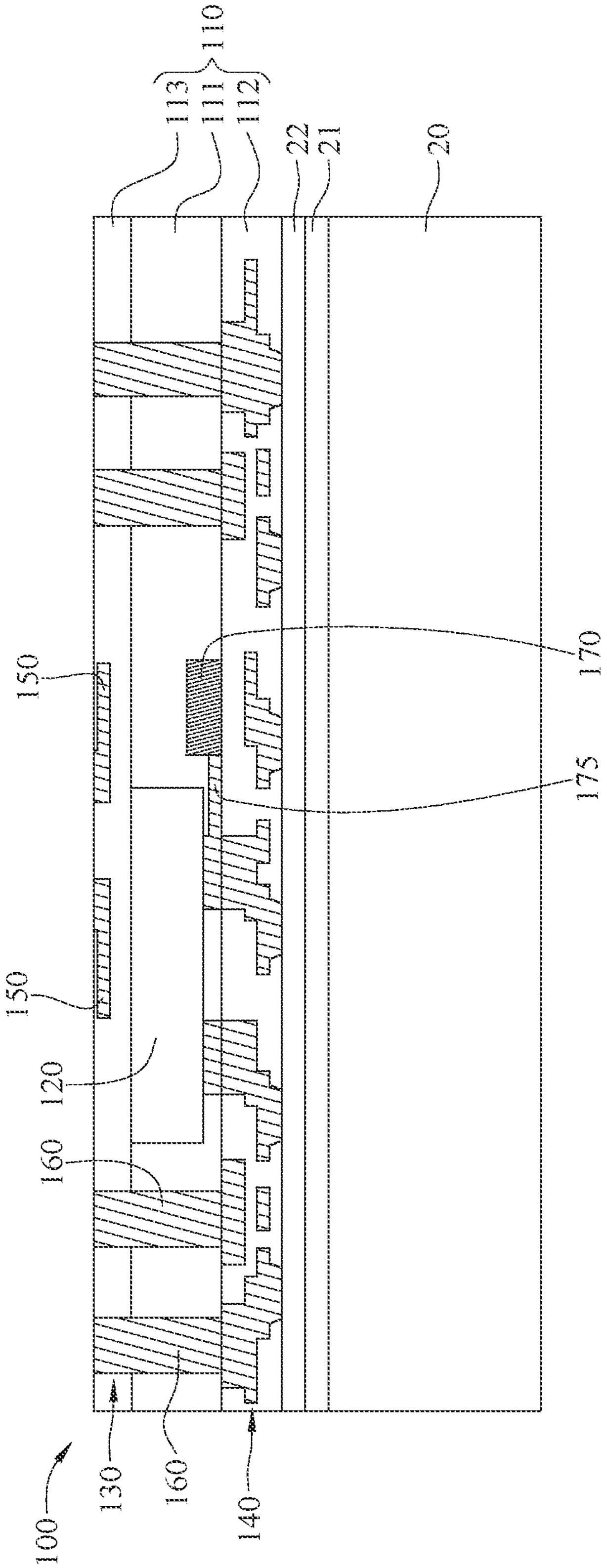
Figure 8:
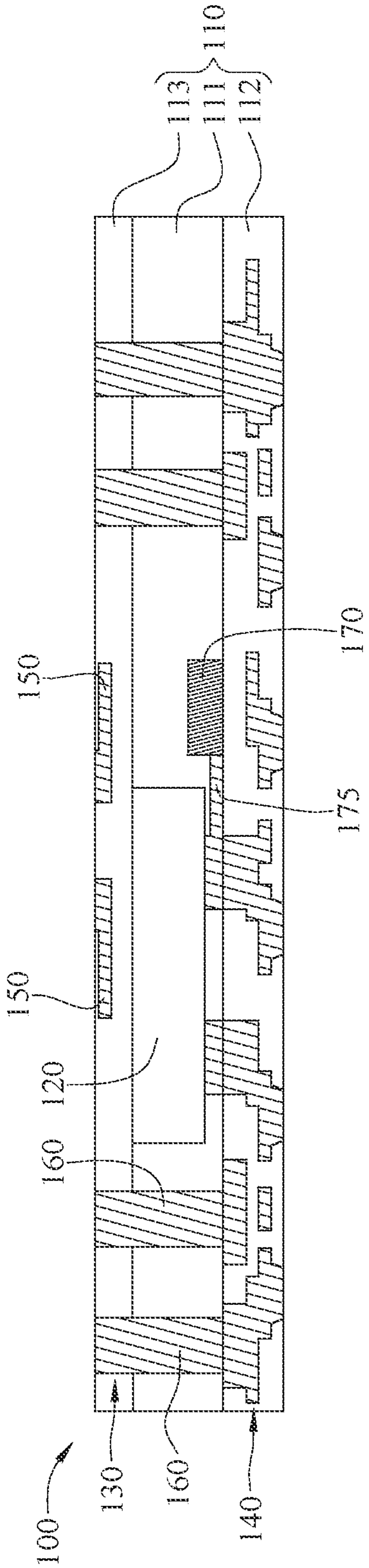

For example, as shown in FIGS. 2 to 8, a process for providing the first package assembly 100 may include following steps. As shown in FIG. 2, a substrate 20 is provided. The substrate 20 may be a glass carrier substrate, a metal substrate or a silicon substrate. In addition, a release layer 21 may be disposed on the substrate 20. Next, as shown in FIG. 3, an intermediate layer 22 is formed on the release layer 21, and a bottom RDL including the first circuit layer 140 and the first polymer layer 112 and the electrical connection structure 175 are formed on the intermediate layer 22. The intermediate layer 22 is, for example, a seed layer. Next, as shown in FIG. 4, the plurality of first conductive vias 160 are formed on the first circuit layer 140. Next, as shown in FIG. 5, the first chip 120 and the capacitive structure 170 are bonded to the bottom RDL. Next, as shown in FIG. 6, the molding compound 111 is formed on the bottom RDL, and a planarization is performed on the first chip 120 and the molding compound 111 by, for example, polishing. Next, as shown in FIG. 7, a top RDL including the second circuit layer 150 and the second polymer layer 113 is formed on the first chip 120 and the molding compound 111, and a planarization is performed on the second circuit layer 150 and the second polymer layer 113 by, for example, polishing. Next, as shown in FIGS. 7 and 8, the substrate 20, the release layer 21 and the intermediate layer 22 are removed to provide the first package assembly 100.

Figure 9:
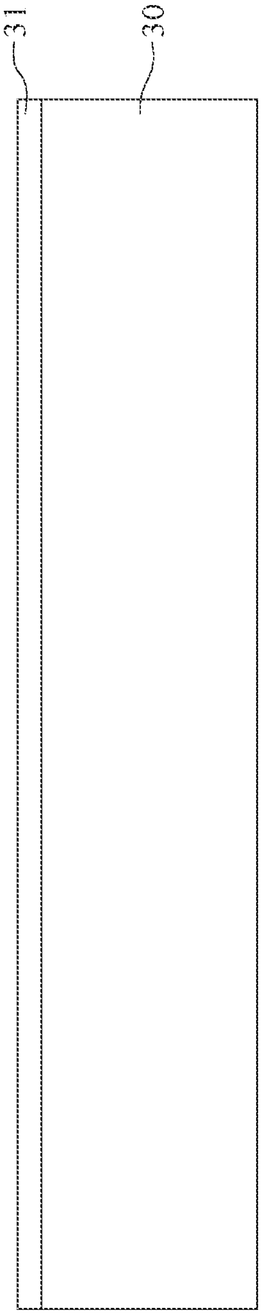
Figure 10:
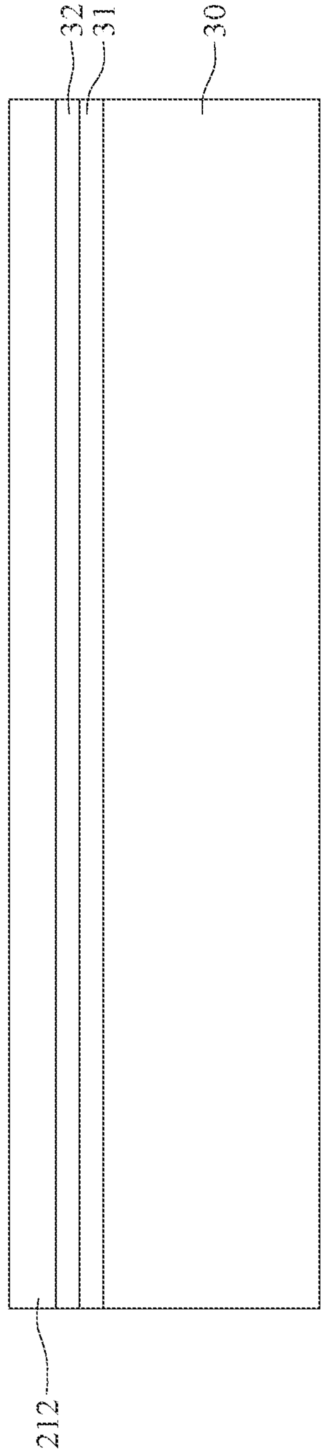
Figure 11:
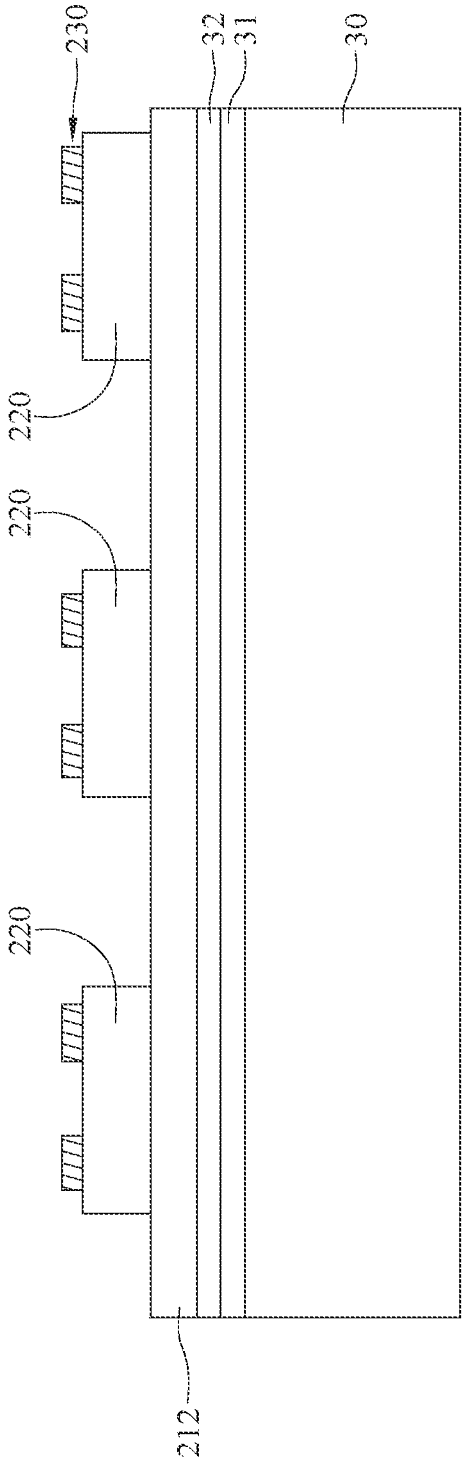
Figure 12:
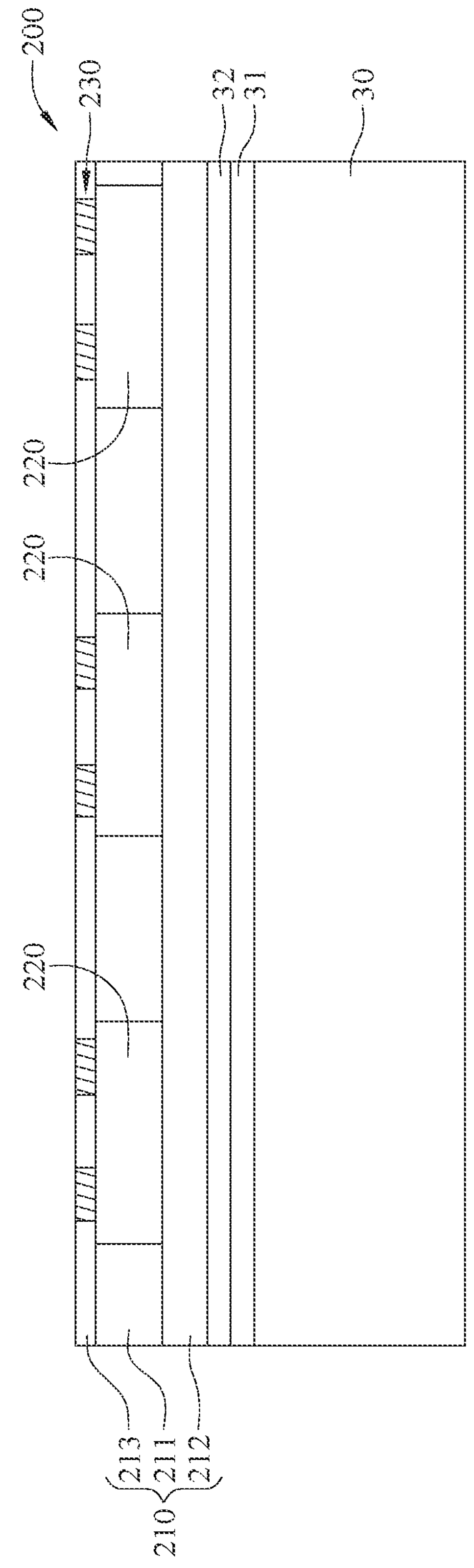
Figure 13:
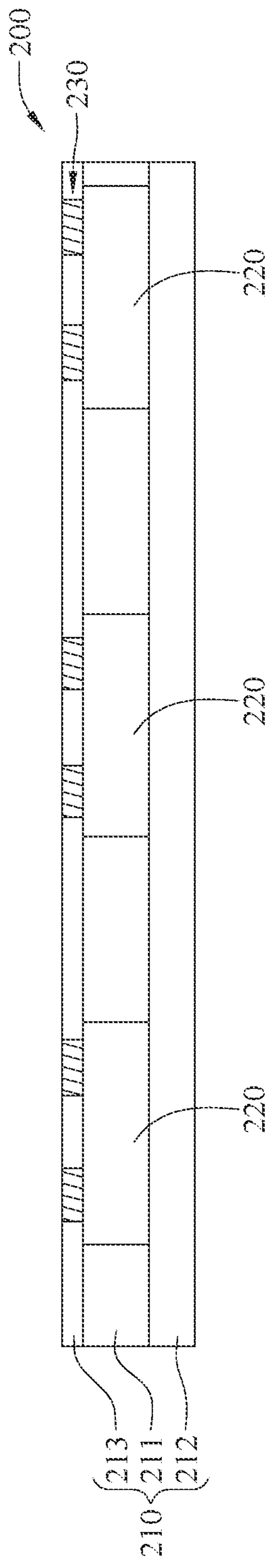

As shown in FIGS. 9 to 13, a process for providing the second package assembly 200 may include following steps. As shown in FIG. 9, a substrate 30 is provided. The substrate 30 may be a glass carrier substrate, a metal substrate or a silicon substrate. Further, a release layer 31 may be disposed on the substrate 30. Next, as shown in FIG. 10, an intermediate layer 32 is formed on the release layer 31, and the third polymer layer 212 is formed on the intermediate layer 32. The intermediate layer 32 is, for example, a seed layer. Next, as shown in FIG. 11, the second chip 220 is bonded to the third polymer layer 212, and the second conductive structure 230 is formed on the second chip 220. Next, as shown in FIG. 12, the molding compound 211 and the fourth polymer layer 213 are formed on the third polymer layer 212, and a planarization is performed on the fourth polymer layer 213 and the second conductive structure 230 by, for example, polishing. Next, as shown in FIGS. 12 and 13, the substrate 30, the release layer 31 and the intermediate layer 32 are removed to provide the second package assembly 200.

In this embodiment, the molding compounds 111 and 211, the first polymer layer 112, the second polymer layer 113, the third polymer layer 212 and the fourth polymer layer 213 may be made of the same material, such as Ajinomoto Build-Up Film (ABF) or Epoxy.

Figure 14:
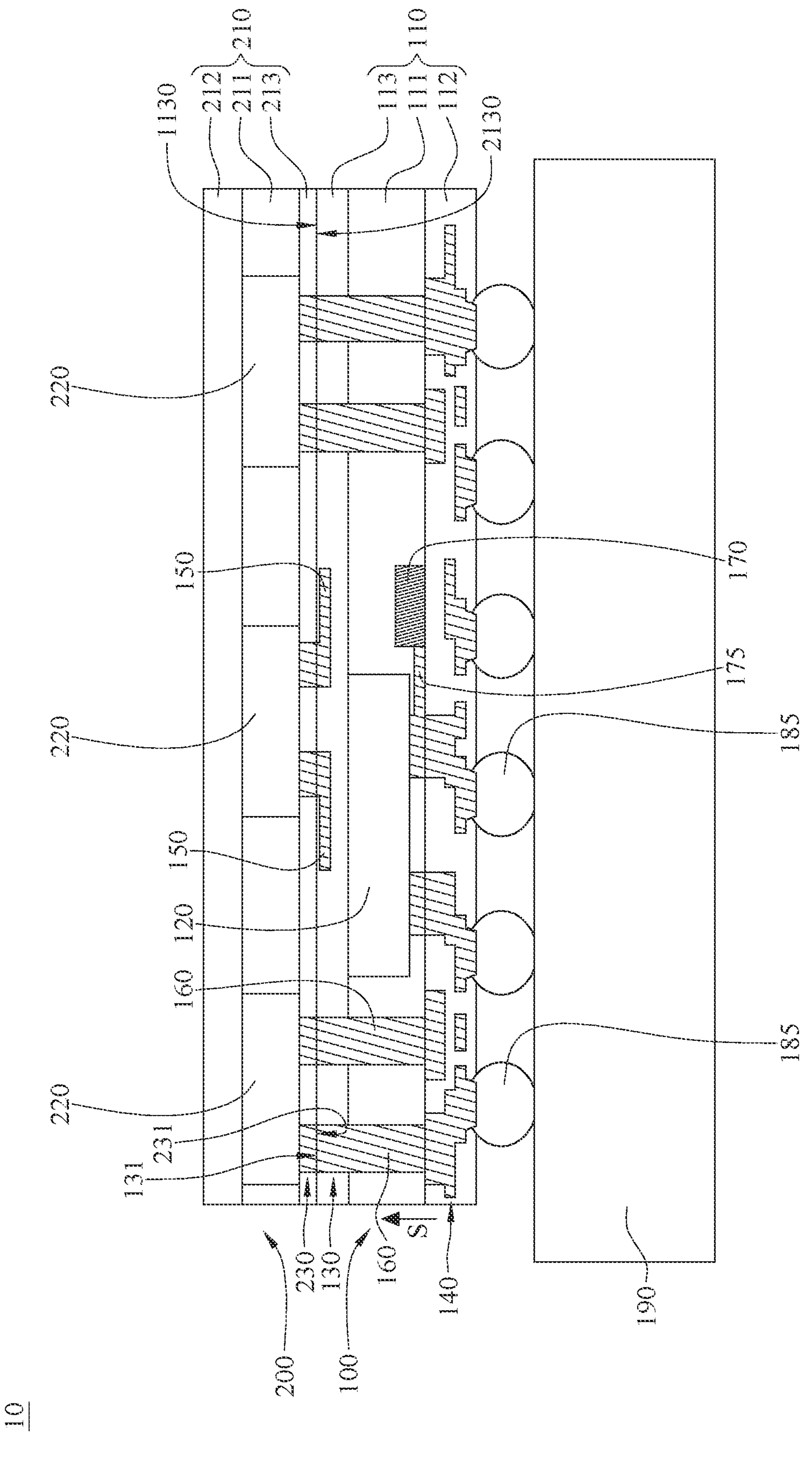

Next, as shown in FIG. 14, a bonding process is performed. The said bonding process includes directly bonding the first bonding surface 1130 of the first dielectric layer 110 to the second bonding surface 2130 of the second dielectric layer 210, and directly bonding the first electrical connection surfaces 131 of the first conductive structure 130 to the second electrical connection surfaces 231 of the second conductive structure 230, so as to form a package structure 10.

In the bonding process, the second polymer layer 113 and the fourth polymer layer 213 that do not totally cure are pressed under a temperature ranging from 90 degrees Celsius to 130 degrees Celsius. Next, the first bonding surface 1130 is directly bonded to the second bonding surface 2130 under a temperature ranging from 100 degrees Celsius to 250 degrees Celsius when the second polymer layer 113 and the fourth polymer layer 213 are melted. Next, the first electrical connection surfaces 131 of the first conductive structure 130 are directly bonded to the second electrical connection surfaces 231 of the second conductive structure 230 under a temperature ranging from 150 degrees Celsius to 400 degrees Celsius, so as to electrically connect the first conductive structure 130 to the second conductive structure 230. In FIG. 14, for the convenience of description, the boundary line between the first bonding surface 1130 and the second bonding surface 2130 and the boundary line between the first electrical connection surface 131 and the second electrical connection surface 231 are shown. In practical, the first bonding surface 1130 and the second bonding surface 2130 that are bonded may be integrally formed as a single piece without any boundary therebetween, and the first electrical connection surface 131 and the second electrical connection surface 231 that are bonded may be integrally formed as a single piece without any boundary therebetween.

The first bonding surface 1130 is directly bonded to the second bonding surface 2130, and the first electrical connection surfaces 131 are directly bonded to the second electrical connection surfaces 231. Thus, without any bump, the warpage is prevented from occurring on the first package assembly 100 and the second package assembly 200 and thus the reliability thereof is enhanced. Moreover, the volume of the package structure 10 is reduced so that the density and the performance of the package structure 10 is allowed to be improved.

Furthermore, since the first dielectric layer 110 and the second dielectric layer 210 are directly used as molding compound after the first bonding surface 1130 and the second bonding surface 2130 are bonded, the process of filling additional molding compound is allowed to be omitted. In this way, the manufacturing process of the package structure 10 is simplified.

Other embodiments are described below for illustrative purposes. The following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 15:
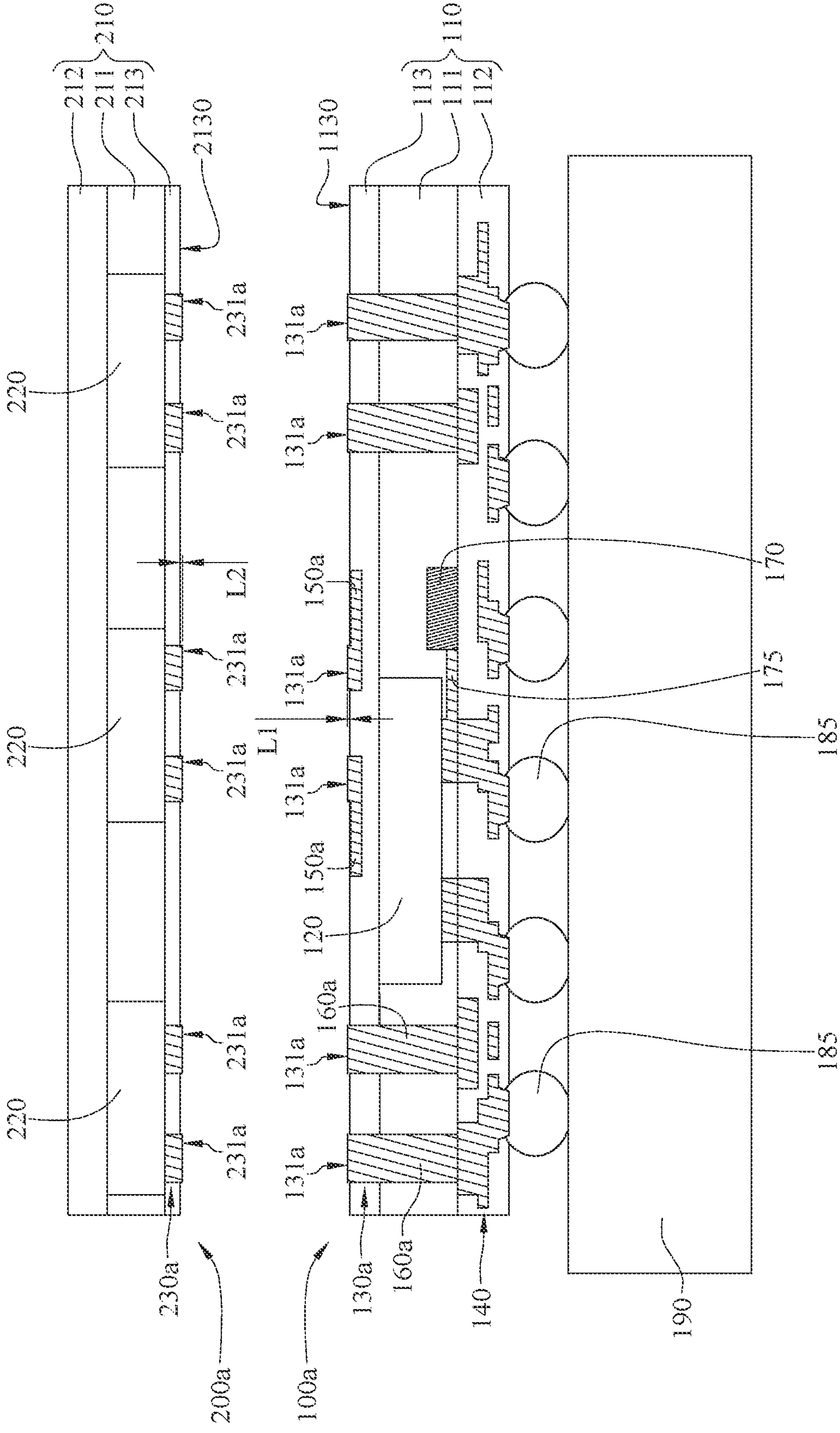
FIG. 15 shows a manufacturing method of a package structure according to a second embodiment of the disclosure.

In this disclosure, the electrical connection surface is not limited to being flush with the bonding surface. Please refer to FIG. 15 that shows a manufacturing method of a package structure according to a second embodiment of the disclosure. The difference between the manufacturing method of a package structure of this embodiment and that of the first embodiment is in the relationship between the electrical connection surface and the bonding surface. In detail, in this embodiment, in the step of providing a first package assembly 100*a* and a second package assembly 200*a*, a plurality of first electrical connection surfaces 131*a* located on a second circuit layer 150*a* and a first conductive via 160*a* protrude from the first bonding surface 1130 along a direction away from the first chip 120, and a plurality of second electrical connection surfaces 231*a* of a second conductive structure 230*a* protrude from the second bonding surface 2130 along a direction away from the second chip 220. For example, a protruding length L1 of each first electrical connection surface 131*a* relative to the first bonding surface 1130 is smaller than 1.5 micrometers (μm), and a protruding length L2 of each second electrical connection surface 231*a* relative to the second bonding surface 2130 is smaller than 1.5 μm. In this embodiment, the first electrical connection surfaces 131*a* and the second electrical connection surfaces 231*a* are adjusted to respectively protrude from the first bonding surface 1130 and the second bonding surface 2130 according to the coefficients of thermal expansion of the second polymer layer 113 and the fourth polymer layer 213. In this way, after being bonded, the first electrical connection surfaces 131*a*, the second electrical connection surfaces 231*a*, the first bonding surface 1130 and the second bonding surface 2130 are allowed to be flush with one another without being uneven due to the coefficients of thermal expansion of the second polymer layer 113 and the fourth polymer layer 213.

Figure 16:
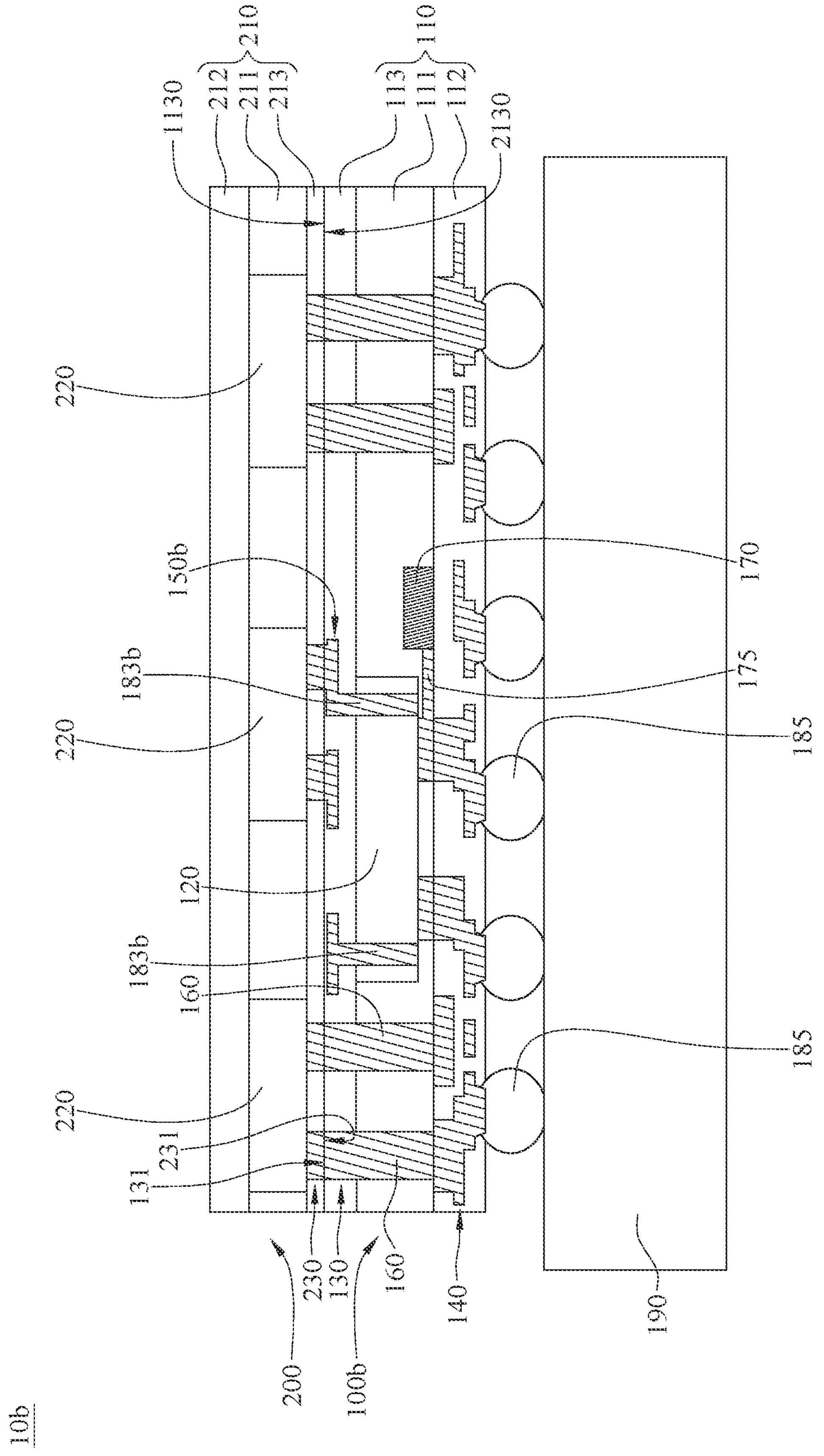
FIG. 16 is a cross-sectional view of a package structure according to a third embodiment of the disclosure.

Please refer to FIG. 16 that is a cross-sectional view of a package structure 10*b* according to a third embodiment of the disclosure. The difference between the package structure 10*b* of this embodiment and the package structure 10 of the first embodiment is in that a first package assembly 100*b* of the package structure 10*b* further includes a plurality of second conductive vias 183*b*. The second conductive vias 183*b* penetrate through the first chip 120, and electrically connect the first chip 120 and the second circuit layer 150*b*, thereby improving the efficiency for one or more signals to be transferred between the first chip 120 and the second circuit layer 150*b*.

Figure 17:
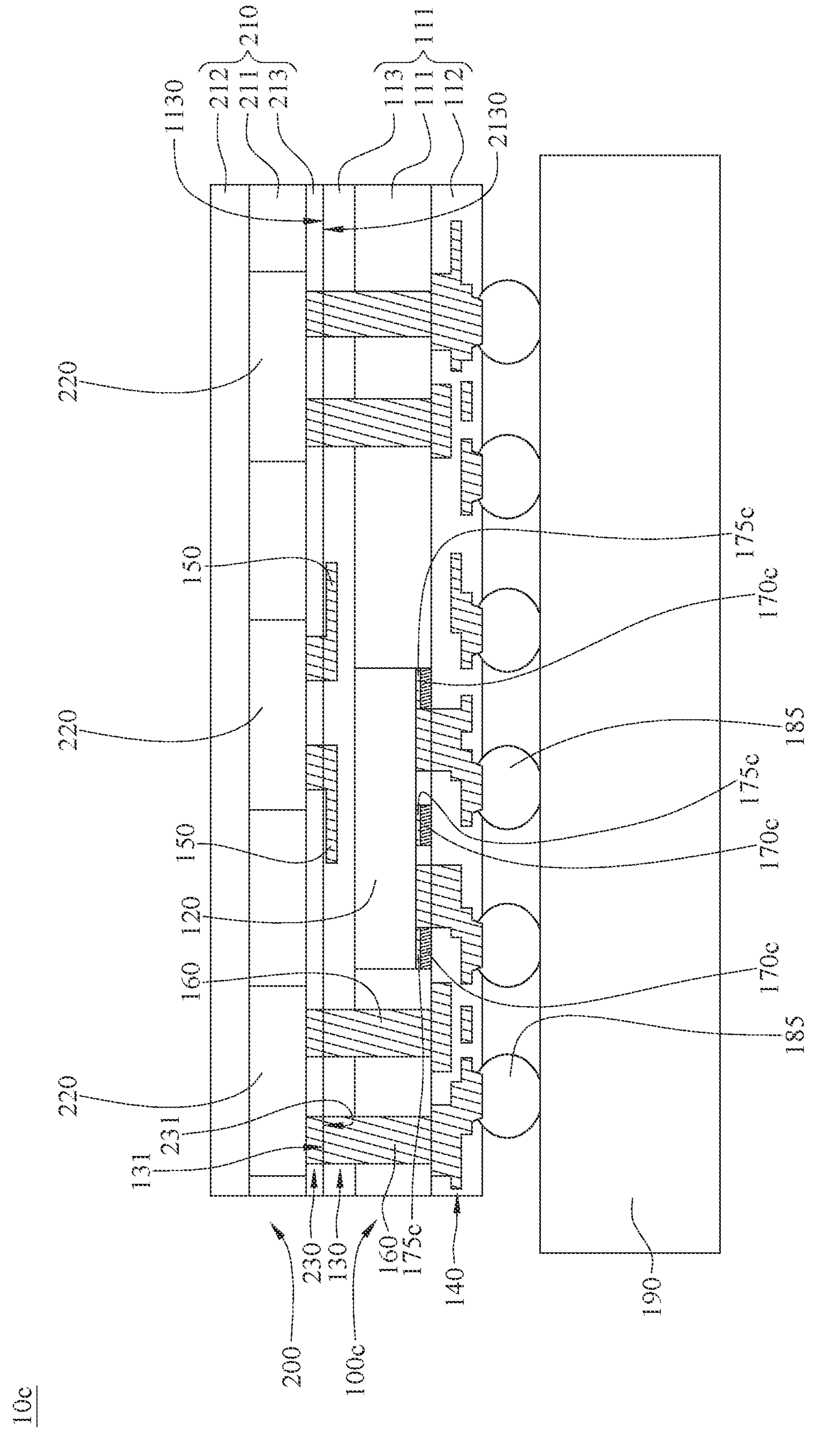
FIG. 17 is a cross-sectional view of a package structure according to a fourth embodiment of the disclosure.

The disclosure is not limited by the quantity and the position of the capacitive structure. Please refer to FIG. 17 that is a cross-sectional view of a package structure 10*c* according to a fourth embodiment of the disclosure. The difference between the package structure 10*c* of this embodiment and the package structure 10 of the first embodiment is in that a first package assembly 100*c* of the package structure 10*c* of this embodiment includes a plurality of capacitive structures 170*c*. The capacitive structures 170*c* are located between the first chip 120 and the first polymer layer 112. Furthermore, the capacitive structures 170*c* are electrically connected to the first chip 120 via a plurality of electrical connection structures 175*c*, respectively. Since the capacitive structures 170*c* are disposed between the first chip 120 and the first polymer layer 112, the efficiency for one or more signals to be transferred between the capacitive structure 170*c* and the first chip 120 is improved.

Figure 18:
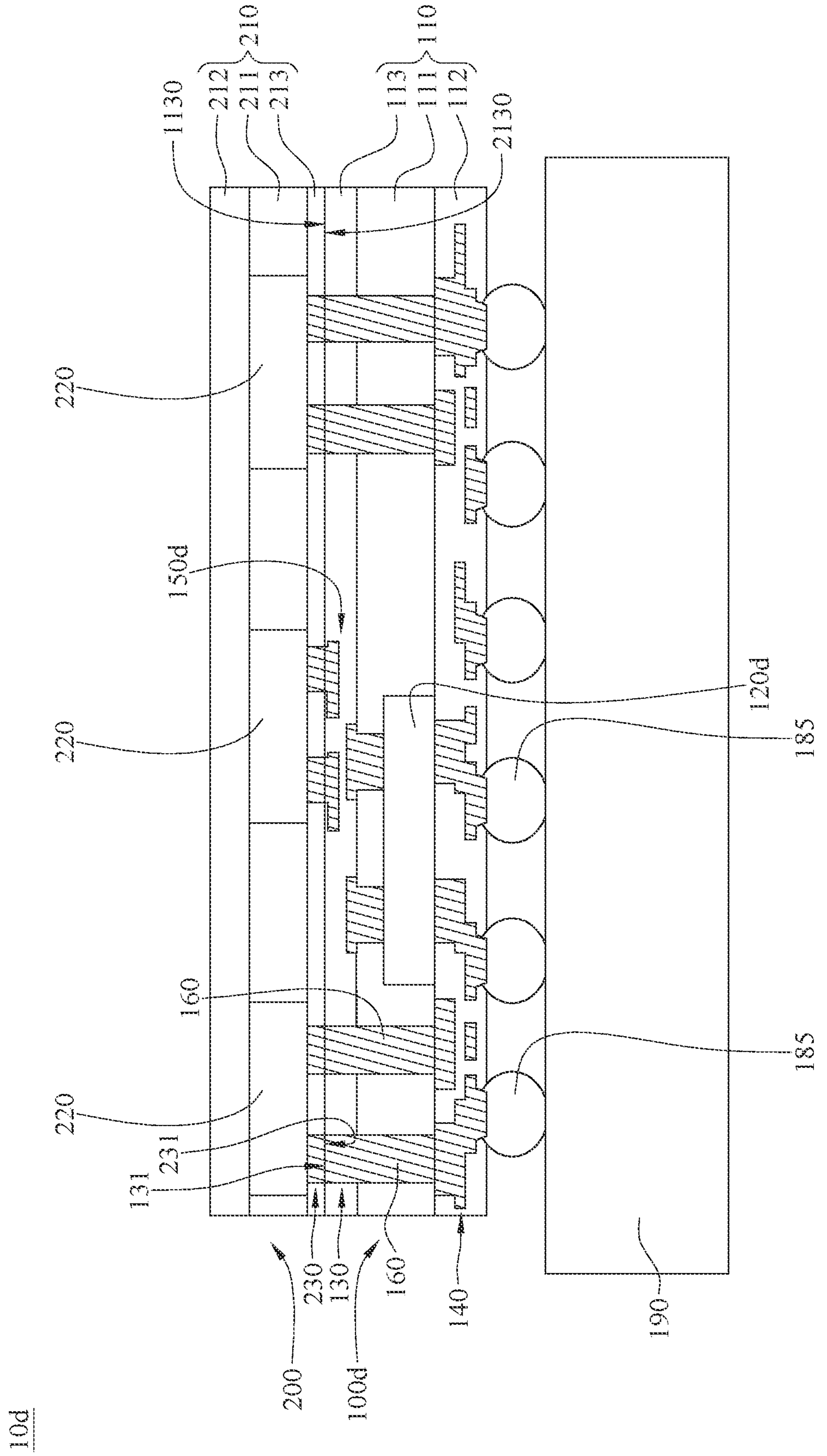
FIG. 18 is a cross-sectional view of a package structure according to a fifth embodiment of the disclosure.

The disclosure is not limited by the configuration of the first chip. Please refer to FIG. 18 that is a cross-sectional view of a package structure 10*d* according to a fifth embodiment of the disclosure. The difference between the package structure 10*d* of this embodiment and the package structure 10 of the first embodiment is in the configuration of the first chip 120*d*. In this embodiment, the first chip 120*d* is in, for example, a face-up form. In addition, in this embodiment, the first chip 120*d* may be electrically connected to the second circuit layer 150*d*.

Figure 19:
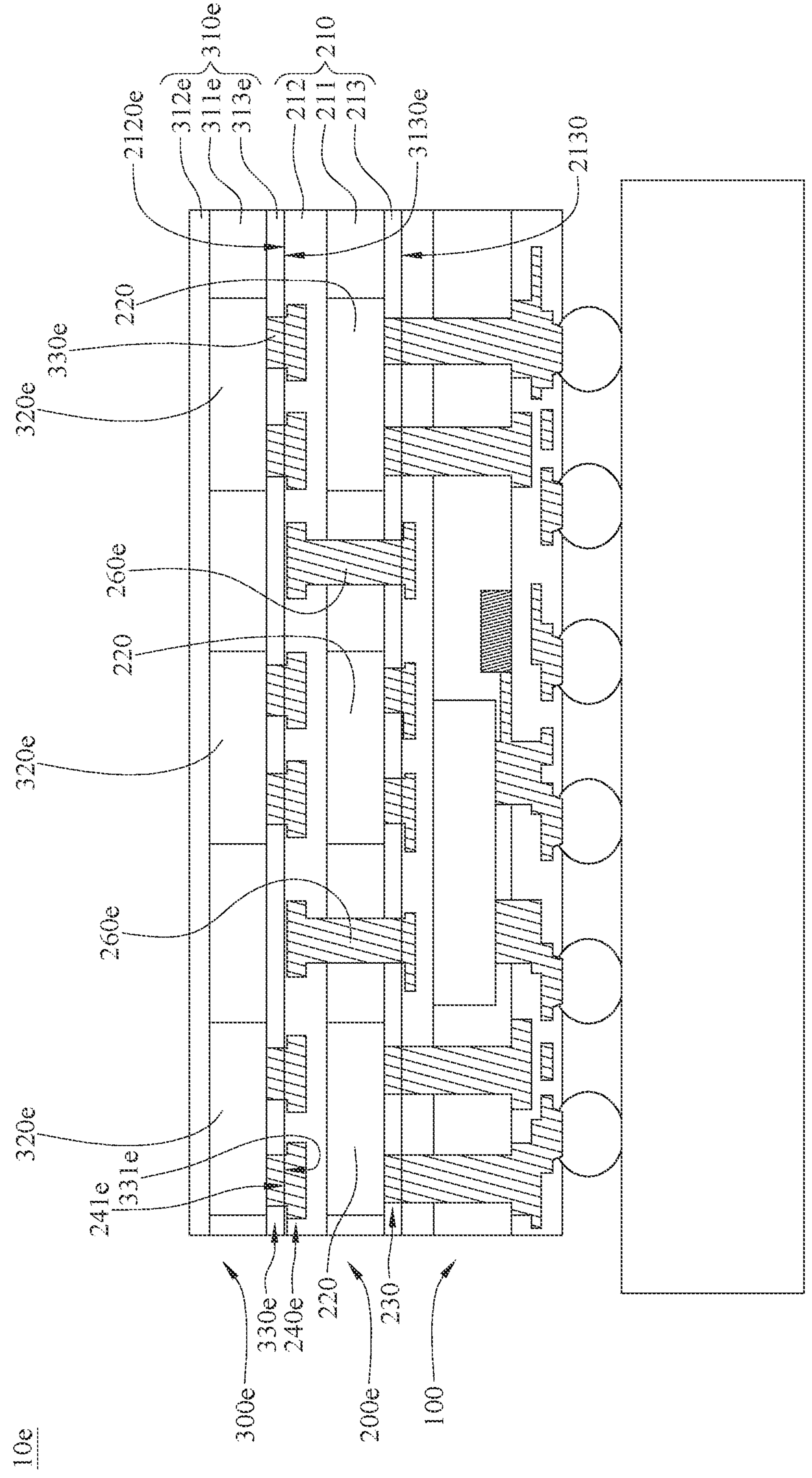
FIG. 19 is a cross-sectional view of a package structure according to a sixth embodiment of the disclosure.

Please refer to FIG. 19 that is a cross-sectional view of a package structure 10*e* according to a sixth embodiment of the disclosure. The difference between the package structure 10*e* of this embodiment and the package structure 10 of the first embodiment is in that the package structure 10*e* of this embodiment further includes a third package assembly 300*e*, and the second package assembly 200*e* further includes structures for bonding the third package assembly 300*e*. In detail, in this embodiment, with respect to the second package assembly 200 of the first embodiment, the second package assembly 200*e* further includes a third conductive structure 240*e* and a plurality of conductive vias 260*e*. The third conductive structure 240*e* is, for example, a circuit layer, and is disposed in the third polymer layer 212. A plurality of third electrical connection surfaces 241*e* of the third conductive structure 240*e* are exposed on a third bonding surface 2120*e* of the third polymer layer 212 facing away from the second bonding surface 2130. The conductive vias 260*e* penetrate through the second dielectric layer 210, and electrically connect the second conductive structure 230 and the third conductive structure 240*e*.

The third package assembly 300*e* includes a third dielectric layer 310*e*, a third chip 320*e*, and a fourth conductive structure 330*e*. The third dielectric layer 310*e* includes a molding compound 311*e* and two polymer layers 312*e* and 313*e*. The third package assembly 300*e* and the second package assembly 200 in the first embodiment are similar in structure, and thus the repeated descriptions are omitted. A plurality of fourth electrical connection surfaces 331*e* of the fourth conductive structure 330*e* are exposed on a fourth bonding surface 3130*e* of the polymer layer 313*e*. The third bonding surface 2120*e* of the second dielectric layer 210 is directly bonded to the fourth bonding surface 3130*e* of the third dielectric layer 310*e*, and the third electrical connection surfaces 241*e* are directly bonded to the fourth electrical connection surfaces 331*e*.

Figure 20:
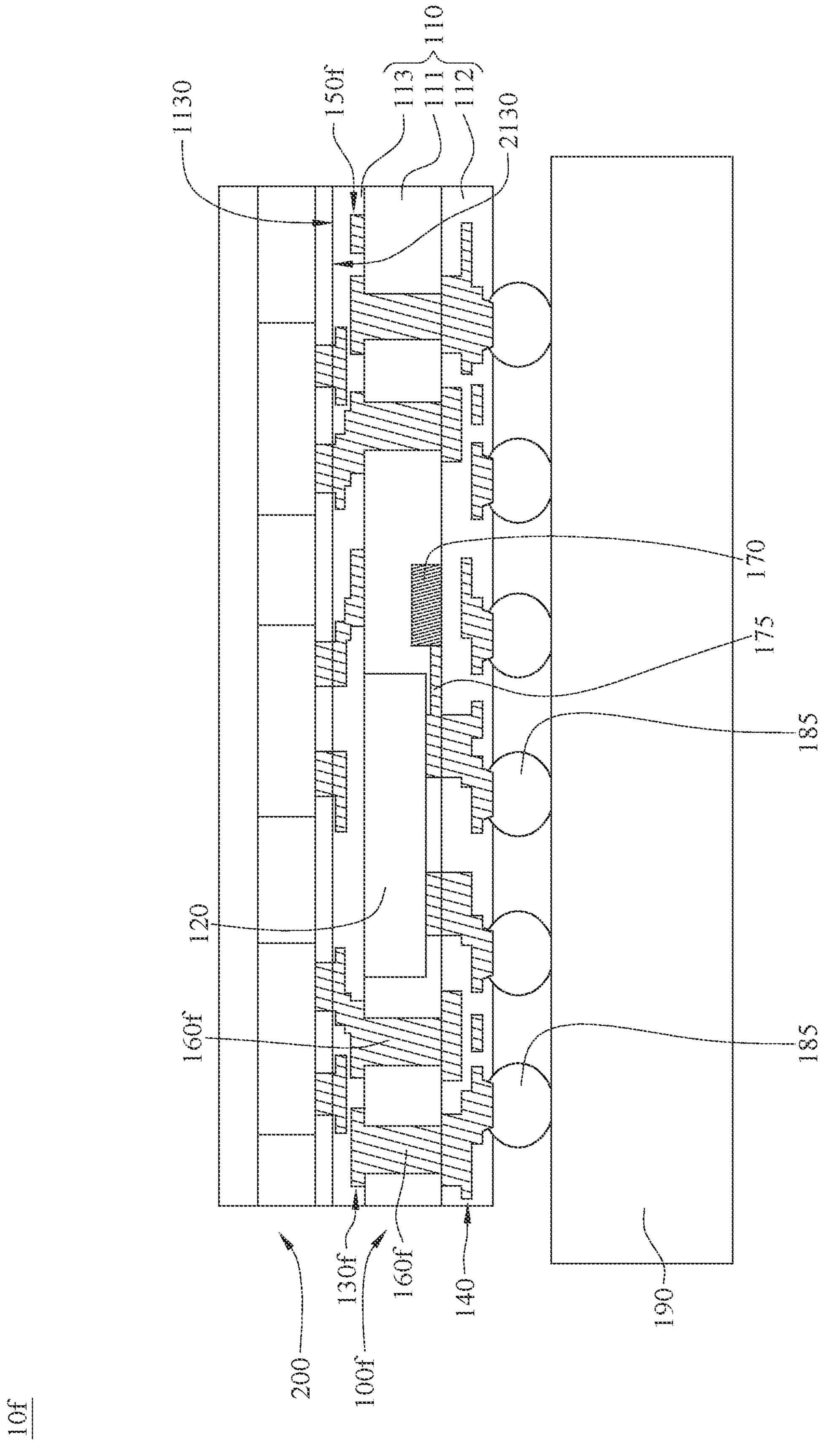
FIG. 20 is a cross-sectional view of a package structure according to a seventh embodiment of the disclosure.

The disclosure is not limited by the configuration of the first conductive via. Please refer to FIG. 20 that is a cross-sectional view of a package structure 10*f* according to a seventh embodiment of the disclosure. The difference between the package structure 10*f* of this embodiment and the package structure 10 of the first embodiment is in the configuration of the first conductive via 160*f*. In the first package assembly 100*f* of this embodiment, the first conductive vias 160*f* of a first conductive structure 130*f* penetrate through the molding compound 111 without penetrating through the first polymer layer 112 and the second polymer layer 113. In addition, the first conductive vias 160*f* electrically connect the first circuit layer 140 and a second circuit layer 150*f*.

Figure 21:
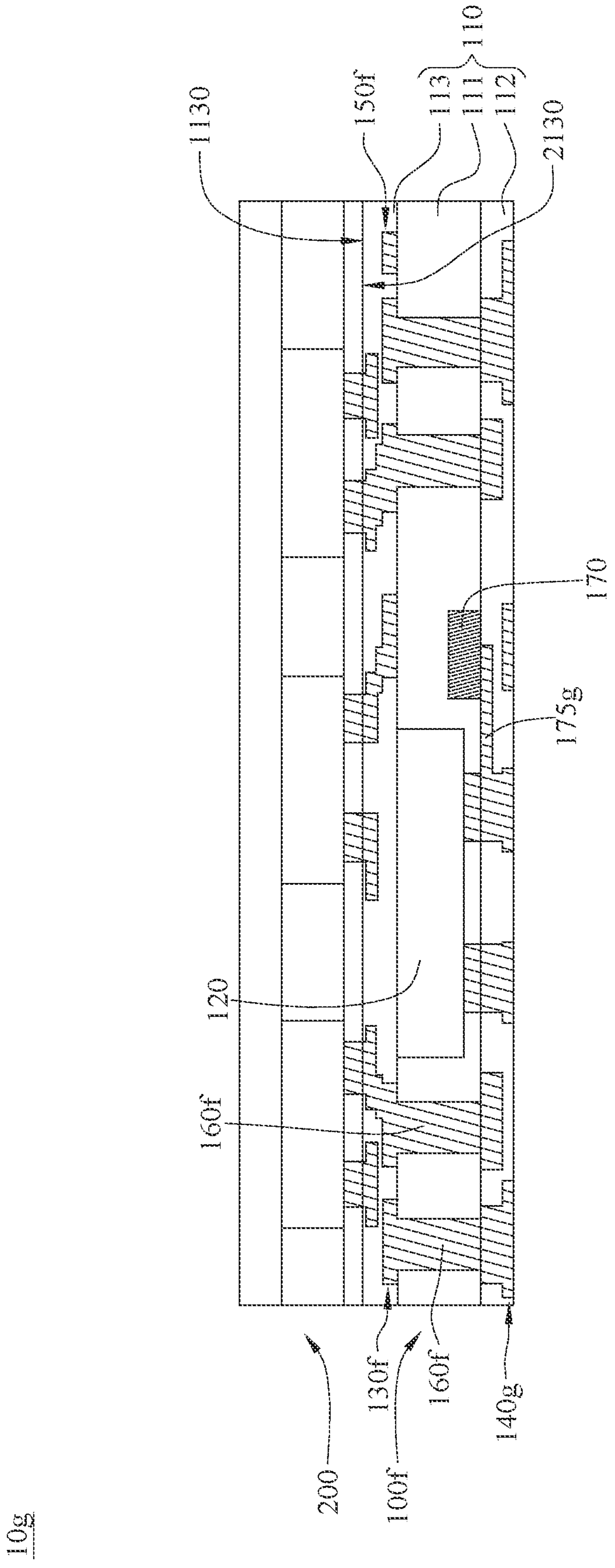
FIG. 21 is a cross-sectional view of a package structure according to an eighth embodiment of the disclosure.

The disclosure is not limited by the configuration of the first circuit layer. Please refer to FIG. 21 that is a cross-sectional view of a package structure 10*g* according to an eighth embodiment of the disclosure. The difference between the package structure 10*g* of this embodiment and the package structure 10*f* of the seventh embodiment is in the configuration of a first circuit layer 140*g*. In this embodiment, the first circuit layer 140*g* includes, for example, two circuit layers. Additionally, in this embodiment, an electrical connection structure 175*g* is located in the first polymer layer 112. The electrical connection structure 175*g* may be formed together with the first circuit layer 140*g*. The first circuit layer 140*g*, the electrical connection structure 175*g* and the first polymer layer 112 may together be referred as a RDL.

According to the package structure and the manufacturing method thereof disclosed by above embodiments, the first bonding surface is directly bonded to the second bonding surface, and the first electrical connection surfaces are directly bonded to the second electrical connection surfaces. Thus, without any bump, the warpage is prevented from occurring on the first package assembly and the second package assembly and thus the reliability thereof is enhanced. Moreover, the volume of the package structure is reduced so that the density and the performance of the package structure is allowed to be improved.

Furthermore, since the first dielectric layer and the second dielectric layer are directly used as molding compound after the first bonding surface and the second bonding surface are bonded, the process of filling additional molding compound is allowed to be omitted. In this way, the manufacturing process of the package structure is simplified.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A package structure, comprising:

a first package assembly, comprising a first dielectric layer, a first chip and a first conductive structure, wherein the first chip is disposed in the first dielectric layer, and a first electrical connection surface of the first conductive structure is exposed on a first bonding surface of the first dielectric layer; and a second package assembly, comprising a second dielectric layer, a second chip and a second conductive structure, wherein the second chip is disposed in the second dielectric layer, and a second electrical connection surface of the second conductive structure is exposed on a second bonding surface of the second dielectric layer; and wherein the first bonding surface of the first dielectric layer is directly bonded to the second bonding surface of the second dielectric layer, and the first electrical connection surface is directly bonded to the second electrical connection surface.

2. The package structure according to claim 1, wherein the first conductive structure of the first package assembly comprises a first circuit layer, a second circuit layer and a first conductive via, the first dielectric layer comprises a molding compound, a first polymer layer and a second polymer layer, the first polymer layer and the second polymer layer are disposed on two opposite sides of the molding compound, respectively, the first chip is disposed in the molding compound, the first bonding surface is located on the second polymer layer and faces away from the molding compound, the first circuit layer and the second circuit layer are disposed in the first polymer layer and the second polymer layer, respectively, the first electrical connection surface is located on the second circuit layer, and the first conductive via penetrates through the molding compound and electrically connects the first circuit layer and the second circuit layer.

3. The package structure according to claim 2, wherein the first package assembly further comprises at least one capacitive structure disposed on the first polymer layer and electrically connected to the first chip.

4. The package structure according to claim 3, wherein the at least one capacitive structure is entirely not overlapped with the first chip along a stacking direction of the molding compound, the first polymer layer and the second polymer layer.

5. The package structure according to claim 3, wherein the at least one capacitive structure comprises a plurality of capacitive structures located between the first chip and the first polymer layer.

6. The package structure according to claim 2, wherein the first package assembly further comprises a second conductive via, the second conductive via penetrates through the first chip and electrically connects the first chip and the second circuit layer.

7. The package structure according to claim 2, wherein the molding compound, the first polymer layer and the second polymer layer are made of same material.

8. The package structure according to claim 7, wherein the molding compound, the first polymer layer and the second polymer layer are made of ABF or Epoxy.

9. The package structure according to claim 1, further comprising a third package assembly, wherein the second package assembly further comprises a third conductive structure, a third electrical connection surface of the third conductive structure is exposed on a third bonding surface of the second dielectric layer facing away from the second bonding surface, the third package assembly comprises a third dielectric layer, a third chip and a fourth conductive structure, the third chip is disposed in the third dielectric layer, a fourth electrical connection surface of the fourth conductive structure is exposed on a fourth bonding surface of the third dielectric layer, the third bonding surface of the second dielectric layer is directly bonded to the fourth bonding surface of the third dielectric layer, and the third electrical connection surface is directly bonded to the fourth electrical connection surface.

10. The package structure according to claim 1, wherein the first bonding surface is directly bonded to the second bonding surface when a part of the first dielectric layer and a part of the second dielectric layer are melted.

11. A manufacturing method of a package structure, comprising:

providing a first package assembly and a second package assembly, wherein the first package assembly comprises a first dielectric layer, a first chip and a first conductive structure, the first chip is disposed in the first dielectric layer, a first electrical connection surface of the first conductive structure is exposed on a first bonding surface of the first dielectric layer, the second package assembly comprises a second dielectric layer, a second chip and a second conductive structure, the second chip is disposed in the second dielectric layer, and a second electrical connection surface of the second conductive structure is exposed on a second bonding surface of the second dielectric layer; and directly bonding the first bonding surface of the first dielectric layer to the second bonding surface of the second dielectric layer, and directly bonding the first electrical connection surface of the first conductive structure to the second electrical connection surface of the second conductive structure to form a package structure.

12. The manufacturing method of a package structure according to claim 11, wherein in a step of providing the first package assembly and the second package assembly, the first electrical connection surface is flush with the first bonding surface and the second electrical connection surface is flush with the second bonding surface.

13. The manufacturing method of a package structure according to claim 11, wherein in a step of providing the first package assembly and the second package assembly, the first electrical connection surface protrudes from the first bonding surface along a direction away from the first chip, and the second electrical connection surface protrudes from the second bonding surface along a direction away from the second chip.

14. The manufacturing method of a package structure according to claim 11, wherein the first bonding surface is directly bonded to the second bonding surface under a temperature ranging from 100 degrees Celsius to 250 degrees Celsius when a part of the first dielectric layer and a part of the second dielectric layer are melted.

15. The manufacturing method of a package structure according to claim 11, wherein the first electrical connection surface is directly bonded to the second electrical connection surface under a temperature ranging from 150 degrees Celsius to 400 degrees Celsius.

* * * * *